(12) United States Patent
Wang et al.

(10) Patent No.: US 9,721,978 B2
(45) Date of Patent: Aug. 1, 2017

(54) THIN FILM TRANSISTOR DEVICE, MANUFACTURING METHOD THEREOF, AND DISPLAY APPARATUS

(71) Applicants: BOE TECHNOLOGY GROUP CO., LTD, Beijing (CN); Chongqing BOE Optoelectronics Technology CO., Ltd, Chongqing (CN)

(72) Inventors: Wu Wang, Beijing (CN); Haijun Qiu, Beijing (CN); Fei Shang, Beijing (CN); Guolei Wang, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 15/030,576

(22) PCT Filed: Aug. 14, 2015

(86) PCT No.: PCT/CN2015/087018
§ 371 (c)(1),
(2) Date: Apr. 19, 2016

(87) PCT Pub. No.: WO2016/086687
PCT Pub. Date: Jun. 9, 2016

(65) Prior Publication Data
US 2016/0336359 A1    Nov. 17, 2016

(30) Foreign Application Priority Data

Dec. 3, 2014 (CN) .......................... 2014 1 0729803

(51) Int. Cl.
*H01L 27/12* (2006.01)
*H01L 21/441* (2006.01)
(Continued)

(52) U.S. Cl.
CPC ...... *H01L 27/1288* (2013.01); *H01L 21/0274* (2013.01); *H01L 21/441* (2013.01);
(Continued)

(58) Field of Classification Search
CPC ............. H01L 27/1288; H01L 27/1225; H01L 21/441; H01L 29/41725; H01L 29/41733; H01L 29/78615; H01L 29/78618
See application file for complete search history.

(56) References Cited

U.S. PATENT DOCUMENTS

2008/0224141 A1* 9/2008 Nam ................. H01L 29/66765
257/59

FOREIGN PATENT DOCUMENTS

CN      103872061 A     6/2014
CN      103915444 A     7/2014
(Continued)

OTHER PUBLICATIONS

The World Intellectual Property Organization (WIPO) International Search Report for PCT/CN2015/087018 Nov. 25, 2015.

*Primary Examiner* — Thanhha Pham
(74) *Attorney, Agent, or Firm* — Anova Law Group, PLLC

(57) ABSTRACT

Various embodiments provide a thin film transistor (TFT) device, a manufacturing method of the TFT device, and a display apparatus including the TFT device. An etch stop layer (ESL) material is formed on an active layer on a substrate. An electrical conductive layer material is formed on the ESL material for forming a source electrode and a drain electrode. The electrical conductive layer material is patterned to form a first portion of the source electrode containing a first via-hole through the source electrode, and to form a first portion of the drain electrode containing a second via-hole through the drain electrode. The ESL mate-
(Continued)

rial is patterned to form an etch stop layer (ESL) pattern including a first ESL via-hole connecting to the first via-hole through the source electrode and including a second ESL via-hole connecting to the second via-hole through the drain electrode.

16 Claims, 7 Drawing Sheets

(51) Int. Cl.
*H01L 29/417* (2006.01)
*H01L 29/786* (2006.01)
*H01L 21/027* (2006.01)
*H01L 21/4757* (2006.01)
*H01L 21/4763* (2006.01)
*H01L 29/45* (2006.01)
*H01L 29/66* (2006.01)

(52) U.S. Cl.
CPC .. *H01L 21/47573* (2013.01); *H01L 21/47635* (2013.01); *H01L 27/1225* (2013.01); *H01L 29/41725* (2013.01); *H01L 29/41733* (2013.01); *H01L 29/45* (2013.01); *H01L 29/66969* (2013.01); *H01L 29/7869* (2013.01); *H01L 29/78615* (2013.01); *H01L 29/78618* (2013.01)

(56) References Cited

FOREIGN PATENT DOCUMENTS

| | | |
|---|---|---|
| CN | 104409415 A | 3/2015 |
| EP | 2800141 A1 | 11/2014 |

\* cited by examiner

US 9,721,978 B2

THIN FILM TRANSISTOR DEVICE, MANUFACTURING METHOD THEREOF, AND DISPLAY APPARATUS

CROSS-REFERENCES TO RELATED APPLICATIONS

This application is a national phase entry under 35 U.S.C. §371 of International Application No. PCT/CN2015/087018, filed on Aug. 14, 2015, which claims priority to Chinese Patent Application No. CN201410729803.0, filed on Dec. 3, 2014. The above enumerated patent applications are incorporated by reference herein in their entirety.

FIELD OF THE DISCLOSURE

The present disclosure generally relates to the field of display technologies, and, more particularly, relates to a thin film transistor (TFT) device, a manufacturing method of the TFT device, and a display apparatus including the TFT device.

BACKGROUND

Amorphous silicon thin film transistor is often used to manufacture thin-film transistor (TFT) display. However, such display has limited applications, due to low electron mobility (e.g., less than 1 $cm^2/V \cdot S$) and due to opaqueness and strong photosensitivity of the amorphous silicon in the visible light range. Compared with the emerging technologies such as organic light-emitting diode (OLED) display technology, transparent liquid crystal display (LCD) technology, and gate driver on array (GOA) glass technology, the thin-film semiconductor materials are desirable to provide higher electron mobility, better amorphous uniformity, and reduced threshold voltage (Vth) shift.

The metal oxide semiconductor thin film in the metal oxide semiconductor thin film transistor (Oxide TFT) may provide advantages including low deposition temperature, high electron mobility, and high visible light transmittance. In addition, the electron mobility of oxide TFT is less dependent on the particles size of the film, i.e., having a high homogeneity or uniformity on threshold voltage (Vth).

FIG. 1 is a schematic illustrating a conventional metal oxide thin film transistor array substrate. Such array substrate includes: a substrate 01 having a first indium tin oxide (ITO) layer (not shown in the sectional view of FIG. 1) formed on the substrate 01.

The array substrate in FIG. 1 also includes: a gate electrode 02 formed on the first ITO layer, a gate insulating layer 03 formed on the gate electrode 02, a metal oxide active layer 04 formed on the gate insulating layer 03, an etch stop layer (ESL) 05 along with source/drain electrodes 06 formed on the metal oxide active layer 04, a passivation layer 07 formed on the source/drain electrodes 06; and a second ITO layer (not shown in the sectional view of FIG. 1) formed on the passivation layer 07.

To form the above-described Oxide TFT array substrate in FIG. 1, a number of patterning processes may be used to sequentially form desired layers on the substrate 01. Each patterning process may include one or more processes including coating a photoresist layer, using a mask to expose the photoresist layer, developing the exposed photoresist layer, etching the desired layer under the photoresist layer, and removing the photoresist layer after etching. When forming the first ITO layer, the gate electrode, the active layer, the etch stop layer, the source/drain electrodes, the passivation layer, and the second ITO layer, various patterning processes may be performed using various different masks. Thus, when forming the Oxide TFT array substrate in FIG. 1, at least about seven times of patterning process are used and each patterning process must use a different mask. This increases manufacturing cost of the array substrate.

The disclosed thin film transistor devices, manufacturing methods, and display apparatus are directed to solve one or more problems set forth above and to solve other problems in the art.

BRIEF SUMMARY OF THE DISCLOSURE

One aspect or embodiment of the present disclosure provides a method for forming a thin-film transistor (TFT) device. An etch stop layer (ESL) material is formed on an active layer on a substrate. An electrical conductive layer material is formed on the ESL material for forming a source electrode and a drain electrode. The electrical conductive layer material is patterned to form a first portion of the source electrode containing a first via-hole through the source electrode, and to form a first portion of the drain electrode containing a second via-hole through the drain electrode. The ESL material is patterned to form an etch stop layer (ESL) pattern including a first ESL via-hole connecting to the first via-hole through the source electrode and including a second ESL via-hole connecting to the second via-hole through the drain electrode.

Optionally, a mask used for patterning the ESL is one of masks used for patterning the electrical conductive layer material and a passivation layer formed over the source electrode and the drain electrode.

Optionally, to pattern the electrical conductive layer material and to pattern the ESL material, a first photoresist layer is formed on the electrical conductive layer material and exposed using the mask for patterning the electrical conductive layer material. The exposed first photoresist layer is then developed to form a first photoresist pattern. The electrical conductive layer material is etched to form the first portion of the source electrode containing the first via-hole through the source electrode, and to form the first portion of the drain electrode containing the second via-hole through the drain electrode. The passivation layer material is formed over the substrate having the source electrode and the drain electrode and patterned to form a passivation layer.

Optionally, a second photoresist layer is formed on the passivation layer material and exposed using another mask for patterning the passivation layer material. The second photoresist layer is developed to form a second photoresist pattern. The passivation layer material is etched to form the passivation layer between the first portion of the source electrode and the first portion of the drain electrode to expose the first via-hole through the source electrode, and to expose the second via-hole through the drain electrode. The ESL material is patterned to form the ESL pattern including the first ESL via-hole through the ESL pattern connecting to the first via-hole through the source electrode and including the second ESL via-hole through the ESL pattern connecting to the second via-hole through the drain electrode using the mask.

Optionally, the electrical conductive layer material is etched by a wet etching. Optionally, the passivation layer material and the ESL material are etched by a dry etching.

Optionally, to pattern the electrical conductive layer material and to pattern the ESL material, a single patterning process is used for patterning the electrical conductive layer material to form the first portion of the source electrode containing the first via-hole through the source electrode, and to form the first portion of the drain electrode containing the second via-hole through the drain electrode; and patterning the ESL material to form the ESL pattern including the first ESL via-hole connecting to the first via-hole through the source electrode and including the second ESL via-hole connecting to the second via-hole through the drain electrode.

Optionally, the single patterning process used for patterning the electrical conductive layer material and for patterning the ESL material includes forming a third photoresist layer on the electrical conductive layer material; using the mask for patterning the electrical conductive layer material to expose the third photoresist layer, the third photoresist layer being developed to form a third photoresist pattern; etching the electrical conductive layer material using the third photoresist pattern to form the first portion of the source electrode containing the first via-hole through the source electrode, and to form the first portion of the drain electrode containing the second via-hole through the drain electrode; and then, etching the ESL material using the third photoresist pattern to form the first ESL via-hole connecting to the first via-hole through the source electrode and to form the second ESL via-hole connecting to the second ESL via-hole through the drain electrode.

Optionally, the electrical conductive layer material is etched by a wet etching, and the ESL material is etched by a dry etching.

Optionally, after forming the first via-hole through the source electrode and forming the second via-hole through the drain electrode, a patterning process is used to form a transparent conductive layer such that the transparent conductive layer connects the active layer with each of the first portion of the source electrode and the first portion of the drain electrode by having the transparent conductive layer on surfaces of the first via-hole through the source electrode, on surfaces of the second via-hole through the drain electrode, on surfaces of the first ESL via-hole, and on surfaces the second ESL via-hole.

Optionally, the transparent conductive layer includes a common electrode or a pixel electrode.

Optionally, after the single patterning process, a passivation layer material is formed and patterned to form a passivation layer. The passivation layer material is etched to remove portions corresponding to the first via-hole through the source electrode and the second via-hole through the drain electrode and to remove portions of the passivation layer material on the first portion of the source electrode and on the first portion of the drain electrode.

Optionally, the passivation layer is formed between the first portion of the source electrode and the first portion of the drain electrode, exposing the first via-hole through the source electrode and exposing the second via-hole through the drain electrode.

Optionally, after forming the passivation layer, a patterning process is used to form a transparent conductive layer, such that the transparent conductive layer connects the active layer with each of the first portion of the source electrode and the first portion of the drain electrode by having the transparent conductive layer on surfaces of the first via-hole through the source electrode, on surfaces of the second via-hole through the drain electrode, on surfaces of the first ESL via-hole, and on surfaces the second ESL via-hole.

Optionally, the transparent conductive layer includes a common electrode or a pixel electrode.

Optionally, before forming the ESL material on the active layer, a gate electrode is formed on the substrate, a gate insulating layer is formed on the gate electrode, and the active layer is on the gate insulating layer.

Another aspect or embodiment of the present disclosure provides a thin film transistor device. The thin film transistor device includes an active layer over a substrate and an etch stop layer (ESL) pattern disposed on the active layer. The ESL pattern includes a first ESL via-hole and a second ESL via-hole through the ESL pattern. A source electrode is disposed on the ESL pattern and includes a first portion of the source electrode containing a first via-hole there-through, the first via-hole of the source electrode connecting to the first ESL via-hole. A drain electrode is disposed on the ESL pattern and includes a first portion of the drain electrode containing a second via-hole there-through, the second via-hole through the drain electrode connecting to the second ESL via-hole. A transparent conductive layer is disposed on the first portion of the source electrode and on the first portion of the drain electrode, and configured to connect the active layer with each of the first portion of the source electrode and the first portion of the drain electrode by having the transparent conductive layer on surfaces of the first via-hole through the source electrode, on surfaces of the second via-hole through the drain electrode, on surfaces of the first ESL via-hole, and on surfaces the second ESL via-hole. The transparent conductive layer further includes another portion used as a common electrode or a pixel electrode of an array substrate in a display apparatus.

Optionally, the source electrode further includes a second portion formed by a portion of the transparent conductive layer, and the drain electrode further includes a second portion formed by a portion of the transparent conductive layer.

Optionally, the active layer is disposed on a gate insulating layer, the gate insulating layer is disposed on a gate electrode, and the gate electrode is disposed on the substrate.

Optionally, each of the source electrode and the drain electrode includes an electrical conductive material including a metal, an indium zinc oxide (IZO), an indium tin oxide (ITO), a polysilicon, a combination thereof. Optionally, the substrate includes a glass substrate.

Another aspect or embodiment of the present disclosure provides a display apparatus including the disclosed thin film transistor device.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Exemplary Embodiment 1

In an exemplary embodiment, a method for forming a thin film transistor (TFT) device is provided. The TFT device may be used in an array substrate. The array substrate may be used in a display apparatus. Various exemplary steps may be used to form a TFT.

In a first step, an active layer is formed on a substrate by a patterning process. In a second step, an ESL material is formed over the substrate having the active layer thereon.

In a third step, an electrical conductive layer material is formed, for example, deposited, on the ESL material. By patterning the electrical conductive layer material, a source electrode, for example, including first and second portions of the source electrode, and a drain electrode, for example, including first and second portions of the drain electrode, are formed. The source electrode may further include a first via-hole and the drain electrode can further include a second via-hole.

In addition, an etch stop layer pattern may be formed by patterning the ESL material. The ESL pattern may include first and second ESL via-holes formed there-through, connecting to the first via-hole through the source electrode and the second via-hole through the drain electrode, respectively, such that a first through-hole is formed through the ESL pattern and the source electrode by the first ESL via-hole and the first via-hole through the source electrode, and a second through-hole is formed through the ESL pattern and the drain electrode by the second ESL via-hole and the second via-hole through the drain electrode.

Specifically, in the exemplary third step, a photoresist layer may be formed on the electrical conductive layer material. A source/drain electrode mask, that is, a mask for forming the source/drain electrode, may be used to expose the photoresist layer. The exposed photoresist layer is then developed. The electrical conductive layer material is then etched using the source/drain electrode mask to form the first portion and the first via-hole of the source electrode and to form the first portion and the second via-hole of the drain electrode. Next, the ESL material is etched to form first and second ESL via-holes there-through corresponding to the first via-hole through the source electrode and the second via-hole through the drain electrode, respectively.

As such, a same, single mask may be used for etching the ESL material and for etching the electrical conductive layer material to form the ESL pattern and the source/drain electrodes. Thus, conventionally-required mask used for forming the ESL pattern in a photolithographic process may be omitted. Manufacturing cost of the TFT device may be reduced.

Figure 18:
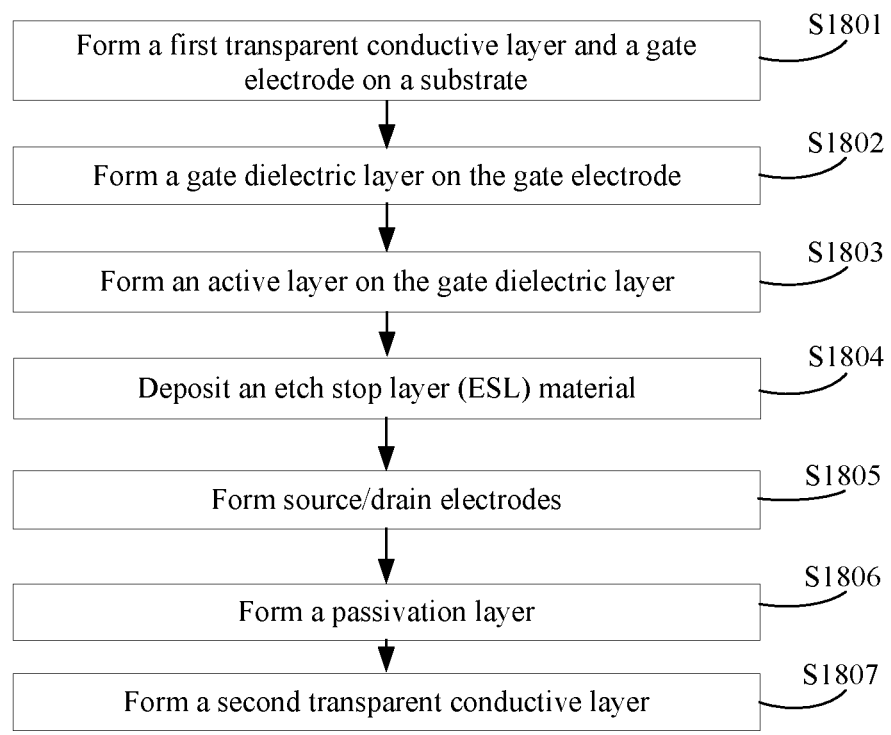
FIG. 18 is a schematic illustrating an exemplary method for forming a TFT device according to various disclosed embodiments.

FIG. 18 illustrates an exemplary method for forming a TFT device, while FIGS. 2-7 illustrate exemplary structures corresponding to various stages of the manufacturing process for manufacturing the TFT device.

Figure 1:
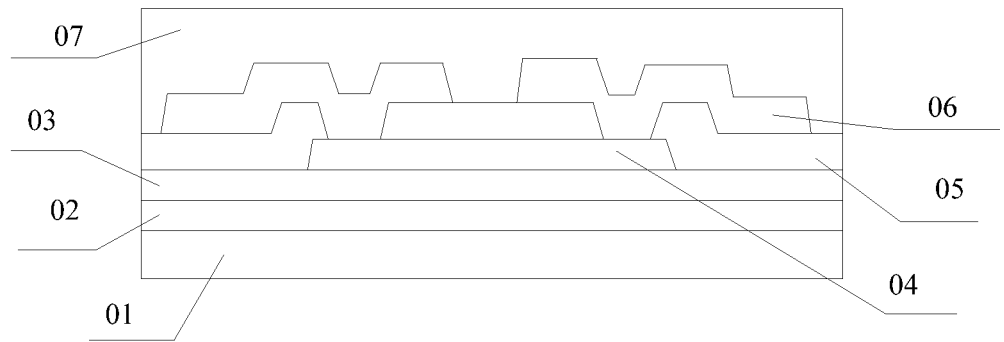
FIG. 1 is a schematic illustrating a conventional metal oxide thin film transistor (TFT) array substrate.
Figure 2:
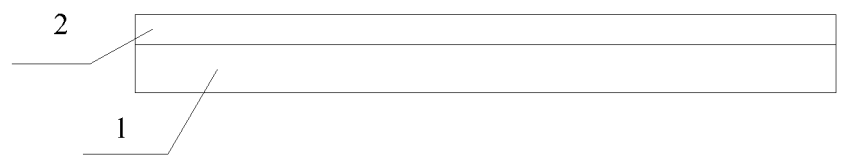
FIG. 2 is a schematic illustrating a structure at a certain stage during formation of an exemplary TFT device after forming a gate electrode according to various disclosed embodiments.

As shown in FIG. 18, at the beginning of the manufacturing process, a patterning process can be used to form a first transparent conductive layer and a gate electrode layer on a substrate (S1801). FIG. 2 illustrates a corresponding structure.

As shown in FIG. 2, a first transparent conductive layer (not shown) may be formed on a substrate 1. The substrate 1 may be, for example, a glass substrate. A gate electrode 2 may then be formed on the substrate 1 having the first transparent conductive layer thereon. In one embodiment, the gate electrode 2 may be formed on the first transparent conductive layer on a surface portion of the substrate 1 and also on the exposed surface of the substrate 1.

In various embodiments, the first transparent conductive layer may be formed after forming other functional layers. In one example, when a twisted nematic (TN) mode is used, only one transparent conductive layer is needed and this first transparent conductive layer may be omitted. For illustration purposes, the disclosed methods/devices/apparatus may be described using a fringe field mode including two transparent conductive layers as an example.

To form the first transparent conductive layer, a transparent conductive material may be formed on the substrate 1 using a method including, for example, a magnetron sputtering, a thermal evaporation, or other suitable film-forming method. Exemplary transparent conductive material may include: indium tin oxide (ITO), indium zinc oxide (IZO), aluminum zinc oxide (AZO), and/or other suitable transparent conductive materials. A photoresist layer may be formed on the transparent conductive material. A mask may be used for exposing the photoresist layer, and then the photoresist layer is developed to form a photoresist pattern. The photoresist pattern may be used as an etch mask to etch the transparent conductive material to form the first transparent conductive layer having a pattern on the substrate 01. The photoresist mask is then stripped or otherwise removed.

Depending on different display modes, the first transparent conductive layer may be a common electrode, for example, used for an advanced ultra-dimensional field conversion mode, or a pixel electrode, for example, used for an ultra-dimensional field conversion mode. The first transparent conductive layer may have a portion (not shown) connected to peripheral wirings and to transmit a corresponding signal there-between.

To form the gate electrode 2, a gate layer material may be formed on the substrate 1 having the first transparent conductive layer thereon, by a method including, for example, sputtering, thermal evaporation, and/or other suitable film-forming method. The gate layer material may include, for example, chromium (Cr), molybdenum (Mo), aluminum (Al), copper (Cu), tungsten (W), neodymium (Nd), indium zinc oxide (IZO), indium tin oxide (ITO), and any combinations, such as, alloys, thereof. In various embodiments, the gate layer material may include one single layer or include multiple sub-layers, each layer including desired material(s).

A photoresist layer may be formed on the gate layer material and can form a photoresist pattern after an exposure and development of the photoresist material. The photoresist pattern can be used as an etch mask to etch the gate layer material to form the gate electrode 2. The photoresist pattern may then be stripped or otherwise removed.

Figure 3:
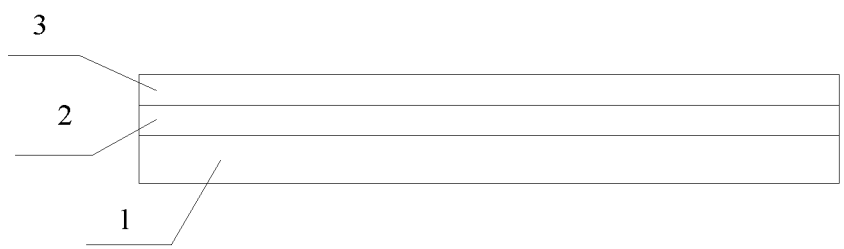
FIG. 3 is a schematic illustrating a structure at a certain stage during formation of an exemplary TFT device after forming a gate insulating layer according to various disclosed embodiments.

Referring back to FIG. 18, a gate insulating layer may be formed (S1802). FIG. 3 illustrates a corresponding structure.

As shown in FIG. 3, a plasma-enhanced chemical vapor deposition (PECVD) method or other suitable methods may be employed to deposit a gate insulating layer 3 on the gate electrode 2. The gate insulating layer 3 may be made of a material including an oxide (e.g. $SiO_x$) and/or a nitride (e.g., $SiN_x$).

Figure 4:
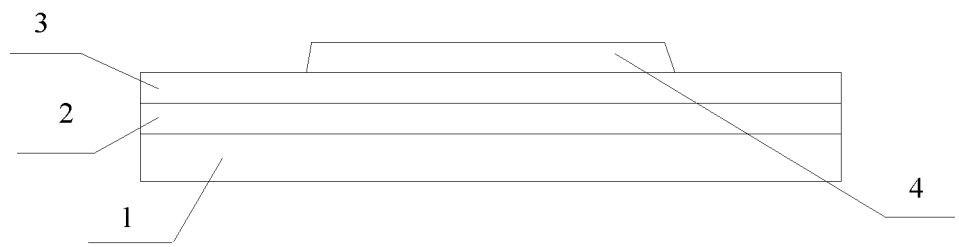
FIG. 4 is a schematic illustrating a structure at a certain stage during formation of an exemplary TFT device after forming an active layer according to various disclosed embodiments.

Referring back to FIG. 18, a patterning process can be used to form an active layer (S1803). FIG. 4 illustrates a corresponding structure.

As shown in FIG. 4, to form an active layer, a semiconductor layer material may be formed on the gate insulating layer 3 over the substrate 1, e.g., using a sputtering or other suitable methods. The semiconductor layer may be a metal oxide semiconductor layer made of a material including, for example, a ZnO-based material and/or an indium gallium zinc oxide (IGZO)-based material. A photoresist layer is formed on the semiconductor layer. A mask is used to pattern the photoresist layer. A photoresist pattern is formed after exposure and development of the photoresist material. The photoresist pattern can then be used as an etch mask to etch the semiconductor layer material to form a patterned semiconductor layer material as the active layer 4. The photoresist pattern can then be removed.

Figure 5:
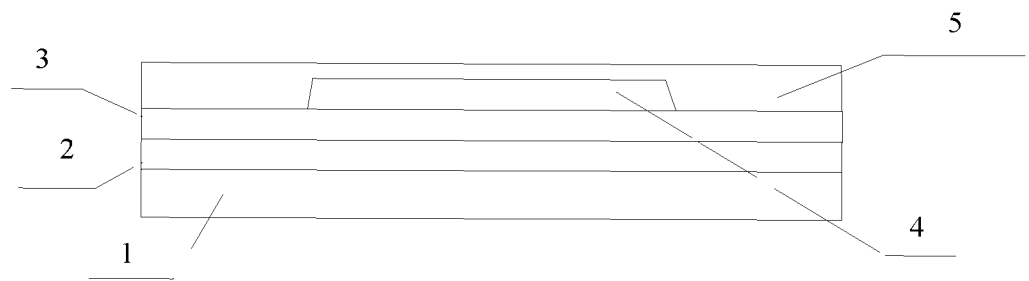
FIG. 5 is a schematic illustrating a structure at a certain stage during formation of an exemplary TFT device after depositing an etch stop layer according to various disclosed embodiments.

Referring back to FIG. 18, an ESL material is then be deposited (S1804). FIG. 5 illustrates a corresponding structure.

As shown in FIG. 5, an ESL material 5 is formed on the active layer 4 and on surfaces of the gate insulating layer 3 exposed by the active layer 4 over the substrate 1, e.g., by a PECVD and/or any other suitable methods. The ESL material 5 can be made of a material including, for example, $SiN_x$ and/or $SiO_x$.

Figure 6:
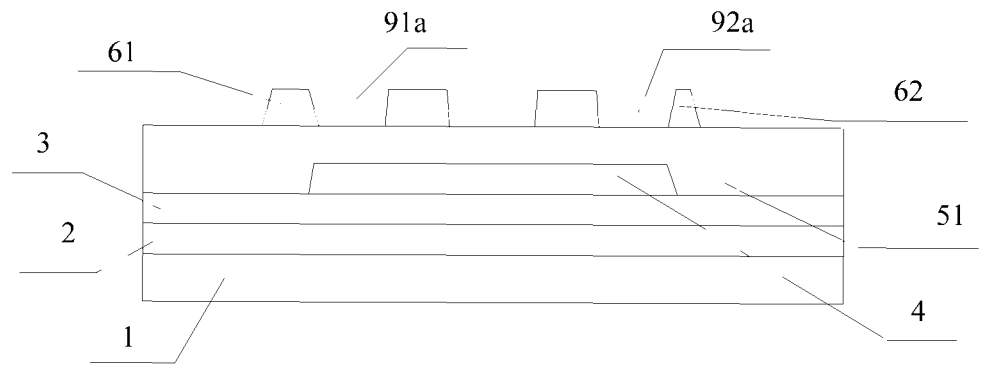
FIG. 6 is a schematic illustrating a structure at a certain stage during formation of an exemplary TFT device after forming source/drain electrodes according to various disclosed embodiments.

Referring back to FIG. 18, source/drain electrodes may be formed (S1805). For example, the source electrode may include a first portion and a first via-hole. The drain electrode may include a first portion and a second via-hole. FIG. 6 illustrates a corresponding structure.

As shown in FIG. 6, the source electrode may include a first portion 61 of the source electrode, and the drain electrode may include a first portion 62 of the drain electrode. Further, the source/drain electrodes may include a second portion, which includes a portion of a subsequently formed second transparent conductive layer.

As shown in FIG. 6, to form the source/drain electrodes, an electrical conductive layer material may be formed on the ESL material 5 over the substrate 1 by a process including, for example, sputtering, thermal evaporation, and/or other suitable film-forming methods. The conductive layer material may include a material including, for example, chromium (Cr), molybdenum (Mo), aluminum (Al), copper (Cu), tungsten (W), neodymium (Nd), indium zinc oxide (IZO), indium tin oxide (ITO), polysilicon, and/or combinations (e.g., alloys) thereof. The conductive layer material may be one single layer or may include multiple sub-layers. A photoresist layer may be formed on the conductive layer material. The photoresist layer may then be exposed and developed to form a photoresist pattern. The photoresist pattern may then be used as an etch mask to etch, e.g., by a wet etching, the electrical conductive layer material to form a first portion 61 of the source electrode, a first portion 62 of the drain electrode, a first via-hole 91a in the source electrode, and a second via-hole 92a in the drain electrode.

It should be noted that, at this stage, only a first portion is formed for the source electrode or the drain electrode, other portions of the source electrode or the drain electrode may be formed later. However, the first via-hole 91a in the source electrode and second via-hole 92a in the drain electrode have been completely formed at this stage. In various embodiments, the first via-hole 91a is formed in the first portion 61 of the source electrode, while the second via-hole 92a is formed in the first portion 62 of the drain electrode. When subsequently forming other portions such as a second portion of the source and the drain electrodes, the first via-hole 91a and second via-hole 92a may stay intact such that the ultimately-formed source electrode remain having the first via-hole 91a and the ultimately-formed drain electrode remain having the second via-hole 92a.

In various embodiments, the first and second via-holes 91a/92a may generally be a through-hole, gap, opening, trench, and/or the like, although the present disclosure is primarily described using the via-hole as an example.

Because the exemplary wet etching may only have etching effect on metal or metal oxide, and may not have etching effect on non-metal oxide, the use of wet etching for etching the electrical conductive layer material may not etch the ESL material 5 underlying the first portions 61/62 of the source/drain electrodes. The ESL material 5 may thus protect the underlying active layer 4 during this wet etching of the conductive layer material for forming the source/drain electrodes.

Figure 7:
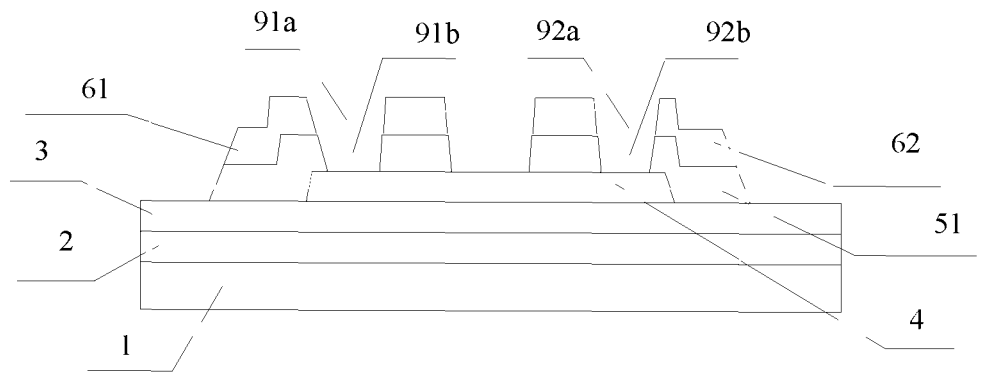
FIG. 7 is a schematic illustrating a structure at a certain stage during formation of an exemplary TFT device after forming an etch stop layer according to various disclosed embodiments.

As shown in FIG. 7, the ESL material 5 may be etched by a dry etching to form an ESL pattern 51 having first and second ESL via-holes 91b and 92b, respectively connecting to the first via-hole 91a of the source electrode and second via-hole 92a of the drain electrode. In some embodiments, the ESL pattern 5 in FIG. 7 may expose a surface portion of underlying gate insulating layer 3. After that, the etch mask, such as the photoresist pattern, used for dry etching the ESL material may be removed.

In various embodiments, the etching process to form the first portions 61/62 in the source/drain electrodes in FIG. 6, and the etching process to etch ESL material in FIG. 7 may use a same mask. That is, a conventional ESL mask may be omitted from the manufacturing process, and the manufacturing cost of the disclosed TFT may be reduced.

Figure 8:
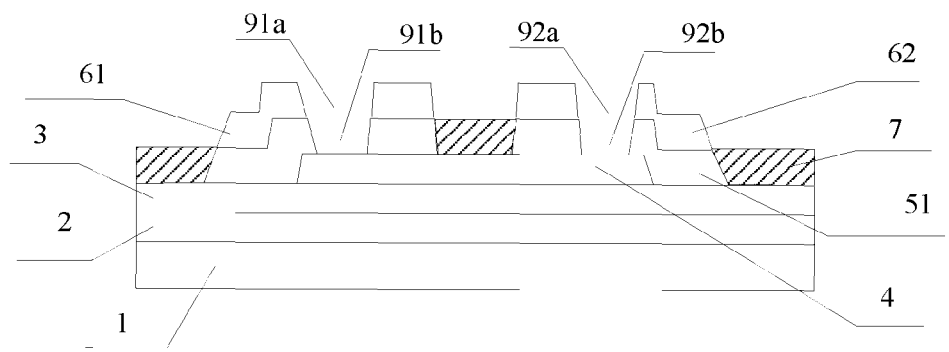
FIG. 8 is a schematic illustrating a structure at a certain stage during formation of an exemplary TFT device after forming a passivation layer according to various disclosed embodiments.

Referring back to FIG. 18, a passivation layer may be formed (S1806). FIG. 8 illustrates a corresponding structure.

In FIG. 8, to form a passivation layer 7, a passivation layer material may be formed on the exposed surface of the structure shown in FIG. 7, for example, by a PECVD and other suitable methods. The passivation layer material may include a material including $SiN_x$ and/or $SiO_x$. A photoresist layer may then be formed on the passivation layer material. The photoresist layer may be exposed and developed to form a photoresist pattern. The photoresist pattern may then be used as an etch mask to etch the passivation layer material covering the entire surface of the structure in FIG. 7, e.g., by a dry etching, to form the passivation layer 7. As shown in FIG. 8, the passivation layer 7 formed by patterning may be on the exposed surface portion of the gate insulating layer 3, on the exposed surfaces of the active layer 14 between the source/drain electrodes, while the first via-hole 91a and second via-hole 92a each exposes a surface portion of the active layer 4. After forming the passivation layer 7 by patterning, the photoresist pattern may be removed.

In various embodiments, other portions of the passivation layer, e.g., corresponding to the source/drain electrode region may also be etched, as long as the active layer 4 is exposed through the first via-hole 91a in the source electrode and through the corresponding first via-hole through the ESL 5, and also is exposed through the second via-hole 92a in the drain electrode and through the corresponding second via-hole through the ESL 5.

Figure 9:
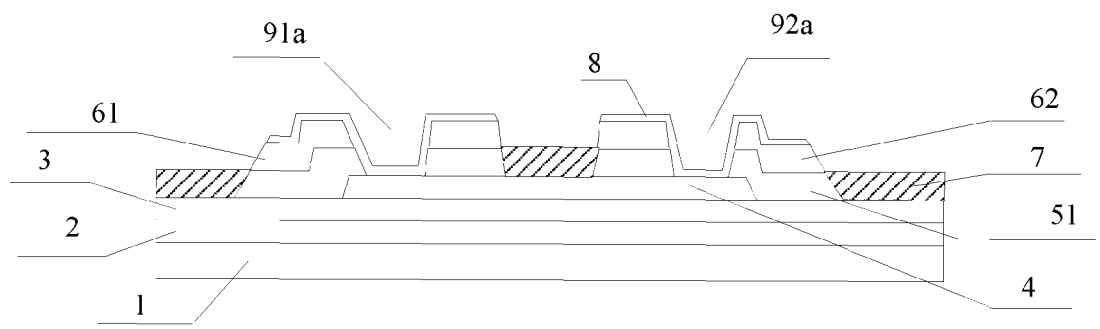
FIG. 9 is a schematic illustrating a structure at a certain stage during formation of an exemplary TFT device after forming a second transparent conductive layer according to various disclosed embodiments.

Referring back to FIG. 18, a second transparent conductive layer may be formed (S1807). FIG. 9 illustrates a corresponding structure.

In FIG. 9, to form the second transparent conductive layer 8, a transparent conductive layer material may be formed over an entire surface of the structure in FIG. 8, by a method including, for example, magnetron sputtering, thermal evaporation, and/or other film-forming methods. The transparent conductive layer material may include a material including indium tin oxide (ITO), indium zinc oxide (IZO), aluminum zinc oxide (AZO), and/or other suitable materials. A photoresist layer may be formed on the transparent conductive layer material. The photoresist layer may be exposed and developed to form a photoresist pattern. The transparent conductive layer material may then be etched using the photoresist pattern as an etch mask in a photolithography process to form a patterned transparent conductive layer material as the second transparent conductive layer 8.

As shown in FIG. 9, the second transparent conductive layer 8 may be formed on surface of the first portion 61 of the source electrode, on surface of the first portion 62 of the drain electrode, on sidewalls of the first via-hole 91a and sidewalls of the first ESL via-hole 91b through the ESL pattern 51 and sidewalls of the second via-hole 92a and sidewalls of the second ESL via-hole 92b through the ESL pattern 51, and on the exposed active layer 4 exposed by the first via-hole 91a and the second via-hole 92a. The photoresist pattern may then be removed after forming the second transparent conductive layer 8.

In various embodiments, a portion of the second transparent conductive layer 8 in FIG. 9 can be used as the second portion of the source/drain electrodes to connect the first portions 61/62 of the source/drain electrodes with the active layer 4.

In various embodiments, the portion of the second transparent conductive layer 8 between the first via-hole 91a and second via-hole 92a of the source/drain electrodes may be removed. The source/drain electrodes may thus be isolated from one another by a portion of the passivation layer 7 formed there-between. In this case, because there is the passivation layer 7 formed between the first via-hole 91a and second via-hole 92a, and when etching the portion of the second transparent conductive layer 8 between the source electrode containing the first via-hole 91a and the drain electrode containing second via-hole 92a, the passivation layer 7 may protect the underlying active layer 4. In this case, manufacturing process may be simplified, while the active layer 4 is not affected.

Depending on different display modes, the second transparent conductive layer 8 may include other portions used as a common electrode, for example, used for an advanced ultra-dimensional field conversion mode, or a pixel electrode, for example, used for an ultra-dimensional field conversion mode. These other portions of the second transparent conductive layer 8 may be connected with peripheral wirings to transmit a corresponding signal.

Exemplary Embodiment 2

In an exemplary embodiment, a method for forming a thin film transistor (TFT) device may include a first step to form an active layer on a substrate by a patterning process. In a second step, an ESL material is formed over the substrate having the active layer thereon.

In a third step, an electrical conductive layer material is formed on the ESL material. By patterning the electrical conductive layer material, a source electrode, for example, including first and second portions of the source electrode, and a drain electrode, for example, including first and second portions of the drain electrode, are formed. The source electrode can further include a first via-hole and the drain electrode can further include a second via-hole.

Next, a passivation layer material is deposited or otherwise formed. A photoresist layer is coated on the passivation layer material. A mask is used to expose the photoresist layer. The exposed photoresist layer may then be developed to form a photoresist pattern. The photoresist pattern may be used as an etch mask to dry etch the passivation layer material and the ESL material to form ESL via-holes in the etch stop layer respectively connecting to a first via-hole through the source electrode and a second via-hole through the drain electrode.

As such, the ESL material, passivation layer material, and/or the electrical conductive layer material may be patterned using a same, single mask without using the conventionally-required mask for forming the ESL pattern in a photolithographic process. Manufacturing cost for forming the TFT device may be reduced.

FIGS. 10-13 illustrate structures corresponding to the exemplary method, as also depicted in FIG. 18. As previously illustrated, Steps S1801-S1805 in FIG. 18 may correspond to the structures in FIGS. 2-6.

For example, at the beginning of the manufacturing process, in Step S1801 of FIG. 18, a patterning process can be used to form a first transparent conductive layer on a substrate, and to form a gate electrode layer on the first transparent conductive layer and the substrate. A corresponding structure is shown in FIG. 2.

In Step S1802 of FIG. 18, a gate insulating layer may be formed. A corresponding structure is shown in FIG. 3.

In Step S1803 of FIG. 18, a patterning process can be used to form an active layer. A corresponding structure is shown in FIG. 4.

In Step S1804 of FIG. 18, an ESL material may then be deposited. A corresponding structure is shown in FIG. 5.

In Step S1805 of FIG. 18, source/drain electrodes may be formed. For example, the source region may include a first portion and a first via-hole. The drain region may include a second portion and a second via-hole. A corresponding structure is shown in FIG. 6. For example, FIG. 10 illustrates a structure similar or same as the structure illustrated in FIG. 6.

Figure 11:
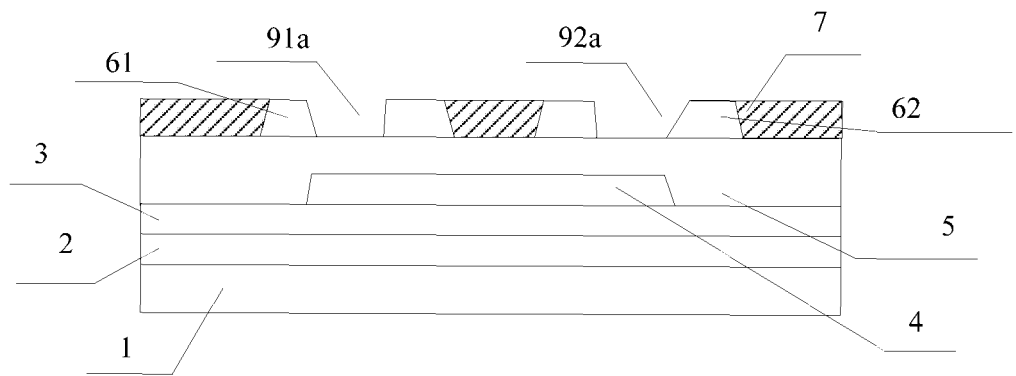
FIG. 11 is a schematic illustrating a structure at a certain stage during formation of another exemplary TFT device after forming a passivation layer according to various disclosed embodiments.

In Step S1806 of FIG. 18, a passivation layer is formed by a patterning process. FIG. 11 illustrates a corresponding structure.

Figure 10:
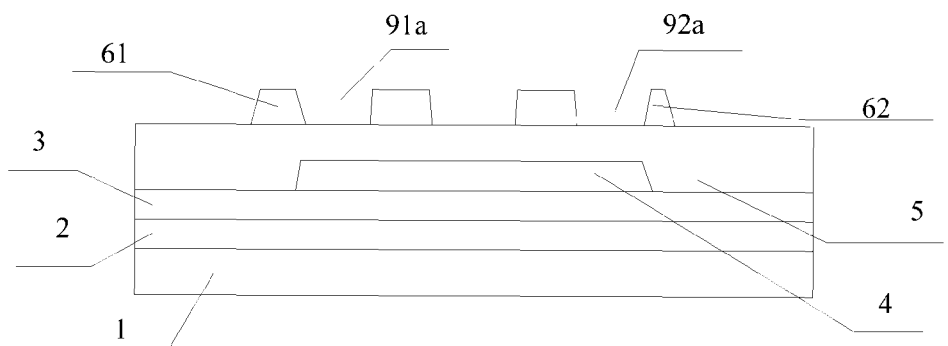
FIG. 10 is a schematic illustrating a structure at a certain stage during formation of another exemplary TFT device after forming source/drain electrodes according to various disclosed embodiments.

As shown in FIG. 11, to form a passivation layer 7, a passivation layer material may be formed on the exposed surface of the structure shown in FIG. 10. For example, the passivation layer material may be formed by a PECVD and other suitable methods. The passivation layer material may include a material including $SiN_x$ and/or $SiO_x$. A photoresist layer may be formed on the passivation layer material. The photoresist layer may be exposed and developed to form a photoresist pattern. The photoresist pattern may be used as an etch mask to etch the passivation layer material covering the entire surface of the structure in FIG. 10, e.g., by a dry etching, to form the passivation layer 7 by a patterning process. As shown in FIG. 11, the patterned passivation layer 7 may be formed on the exposed surface portions of the ESL material 5, that are between source/drain electrodes and outside the source electrode and drain electrode. The first via-hole 91a in the source electrode and the second via-hole 92a in the drain electrode may still expose surface portions of the underlying ESL material 5. Optionally, portions of the passivation layer corresponding to the first portions 61/62 of source/drain electrodes may be etched away to expose the first portions 61/62 of source/drain electrodes.

Figure 12:
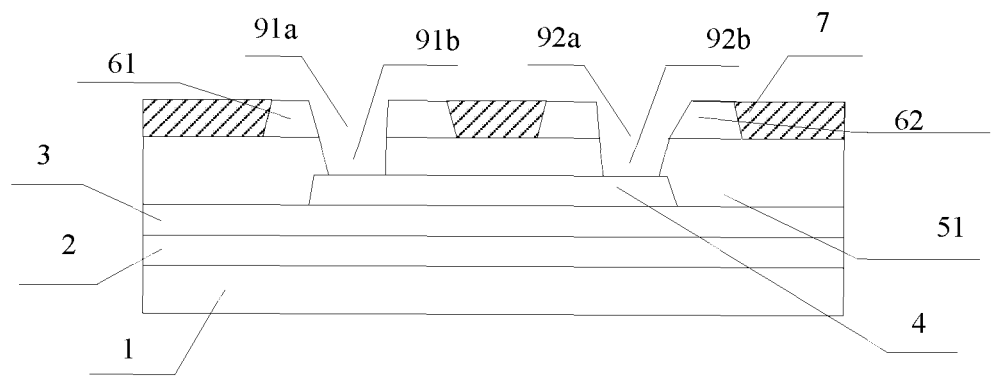
FIG. 12 is a schematic illustrating a structure at a certain stage during formation of another exemplary TFT device after forming an etch stop layer according to various disclosed embodiments.

As shown in FIG. 12, the ESL material 5 exposed by the first via-hole 91a and the second via-hole 92a may be etched, e.g., by a dry etching, to form ESL via-holes 91b and 92b in the patterned ESL material and on the active layer 4. The photoresist pattern used herein may then be removed.

In this case, the passivation layer 7, the source/drain electrodes 61/62, and/or the ESL pattern 51 shown in FIG. 12 may be formed using a same, single mask (e.g., used to expose the first and second via-hole 91a/92a), which reduces manufacturing cost for forming the TFT device.

Figure 13:
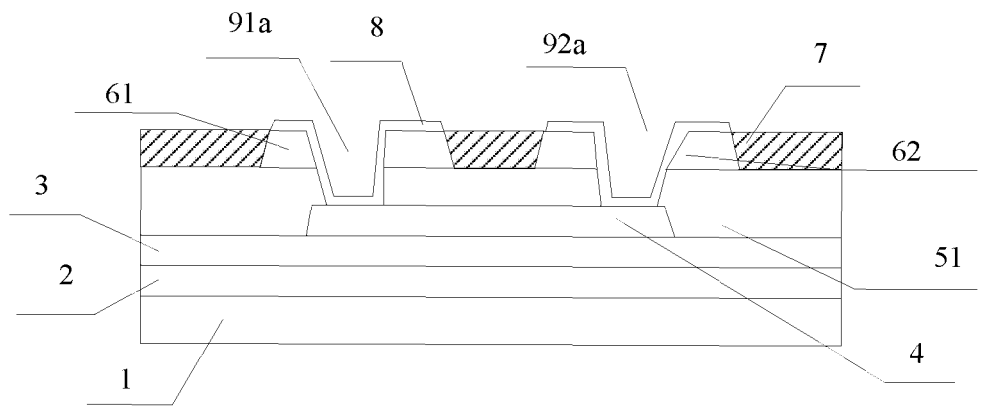
FIG. 13 is a schematic illustrating a structure at a certain stage during formation of another exemplary TFT device after forming a second transparent conductive layer according to various disclosed embodiments.

In Step S1807 of FIG. 18, a second transparent conductive layer may be formed by a patterning process. FIG. 13 illustrates a corresponding structure.

In FIG. 13, to form the second transparent conductive layer 8, a transparent conductive layer material may be formed over an entire surface of the structure in FIG. 12, by a method including, for example, magnetron sputtering, thermal evaporation, and/or other film forming methods. The transparent conductive layer material can include a material including indium tin oxide (ITO), indium zinc oxide (IZO), aluminum zinc oxide (AZO), and/or other suitable materials. A photoresist layer may be formed on the transparent conductive layer material. The photoresist layer may be exposed and developed to form a photoresist pattern. The transparent conductive layer material may then be etched using the photoresist pattern as an etch mask in a photolithography process to form a patterned transparent conductive layer as the second transparent conductive layer 8.

As shown in FIG. 13, the second transparent conductive layer 8 may be formed on surface of the first portion 61 of the source electrode, on surface of the first portion 62 of the drain electrode, on sidewalls of the first via-hole 91a and sidewalls of the first ESL via-hole 91b through the ESL pattern 51, on sidewalls of the second via-hole 92a and sidewalls of the second ESL via-hole 92b through the ESL pattern 51, and on the exposed active layer 4 exposed by the first via-hole 91a and the second via-hole 92a. The photoresist pattern may then be removed after forming the second transparent conductive layer 8.

In various embodiments, a portion of the second transparent conductive layer 8 can be used as the second portion of the source/drain electrodes to connect the first portions 61/62 of the source/drain electrodes with the active layer 4.

As shown in FIG. 13, the second transparent conductive layer 8 does not cover the passivation layer 7 between the first via-hole 91a of the first portion 61 of the source electrode and the second via-hole 92a of the first portion 62 of the drain electrode. The source/drain electrodes may then be isolated from one another by the passivation layer 7 there-between.

Alternatively, referring back to FIG. 10, when etching the conductive layer material to form the first via-hole 91a and second via-hole 92a, the conductive layer material between the source/drain may not be etched away, but may be removed later once the second transparent conductive layer 8 is subsequently formed by the patterning process. In this manner, the manufacturing steps may be simplified, while the active layer 4 is not affected by the etching process.

Depending on different display modes, the second transparent conductive layer 8 may include other portions used as a common electrode, for example, used for advanced ultra-dimensional field conversion mode, or a pixel electrode, for example, used for ultra-dimensional field conversion mode. These other portions of the second transparent conductive layer 8 may be connected with peripheral wirings to transmit a corresponding signal.

Exemplary Embodiment 3

In an exemplary embodiment, a method for forming a thin film transistor (TFT) device is provided. The TFT device may be used in an array substrate. The array substrate may be used in a display apparatus. Various exemplary steps may be used to form a TFT.

In a first step, an active layer is formed on a substrate by a patterning process. In a second step, an ESL material is formed over the substrate having the active layer thereon.

In a third step, an electrical conductive layer material is formed on the ESL material. By patterning the electrical conductive layer material using a photolithographic process, a source electrode, for example, including first and second portions of the source electrode, and a drain electrode, for example, including first and second portions of the drain electrode, are formed. The source electrode can further include a first via-hole and the drain electrode can further include a second via-hole.

Next, the ESL material is etched to form first/second ESL via-holes there-through to connect to the first via-hole through the source electrode and the second via-hole through the drain electrode, respectively. As such, a same, single mask may be used for patterning the ESL material and for patterning the conductive layer material to form the source/drain electrodes. Thus, conventionally-required mask used for forming the ESL in a photolithographic process may be omitted. Manufacturing cost of the array substrate may be reduced.

Figure 19:
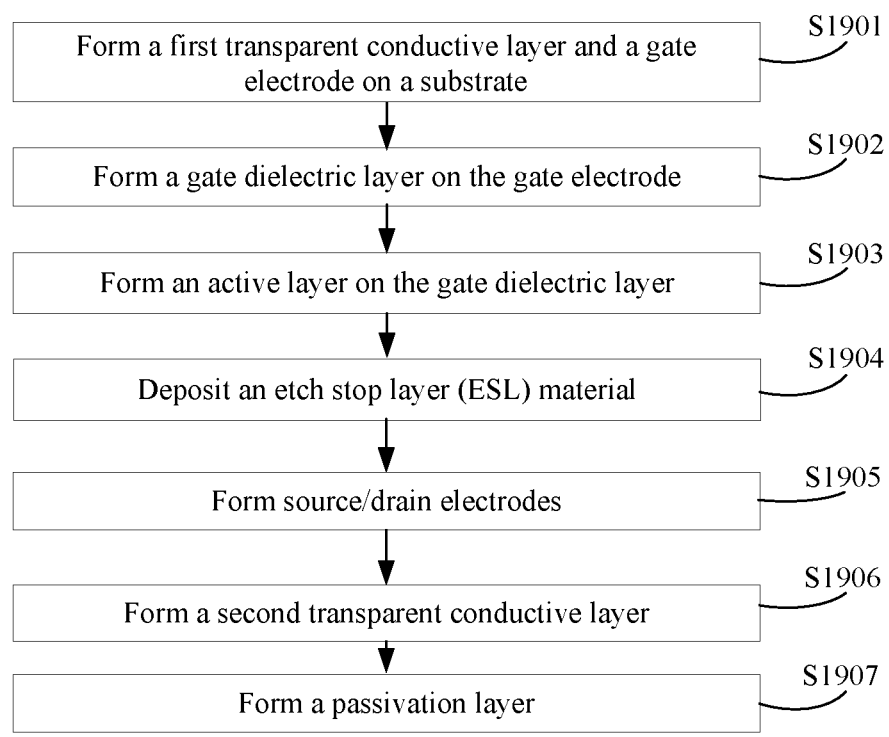
FIG. 19 is a schematic illustrating another exemplary method for forming a TFT device according to various disclosed embodiments.

For example, FIG. 19 depicts another exemplary method for forming a TFT device, while FIGS. 14-17 illustrate structures corresponding to the exemplary method depicted in FIG. 19. In one embodiment, exemplary Steps S1901-S1904 in FIG. 19 may correspond to the structures previously illustrated in FIGS. 2-5.

In Step S1901, at the beginning of the manufacturing process, a patterning process can be used to form a first transparent conductive layer and a gate electrode layer, on a substrate. A corresponding structure is illustrated in FIG. 2.

In Step S1902, a gate insulating layer can be formed. A corresponding structure is illustrated in FIG. 3.

In Step S1903, a patterning process can be used to form an active layer. A corresponding structure is illustrated in FIG. 4.

In Step S1904, an ESL material can then be deposited. A corresponding structure is illustrated in FIG. 5.

Figure 14:
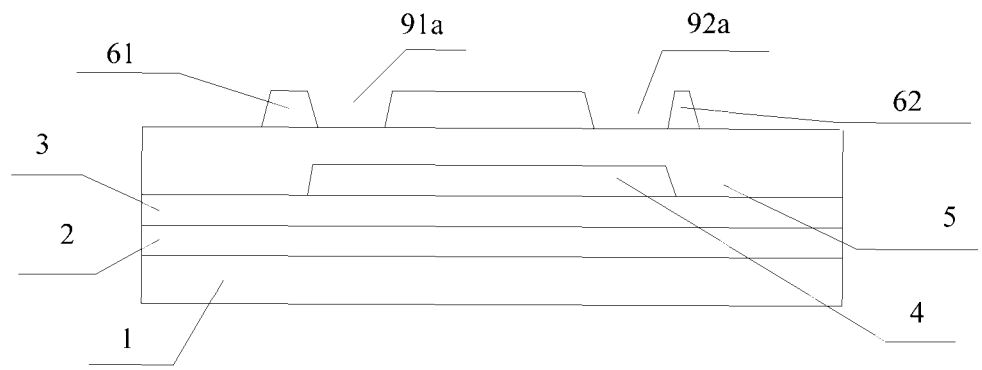
FIG. 14 is a schematic illustrating a structure at a certain stage during formation of an additional exemplary TFT device after forming source/drain electrodes according to various disclosed embodiments.

In Step S1905, a source electrode including a first portion and a first via-hole, and a drain electrode including a first portion and a second via-hole may be formed. FIG. 14 illustrates a corresponding structure.

As shown in FIG. 14, to form source/drain electrodes, an electrical conductive layer material may be formed on the ESL material 5 over the substrate 1 by a process including, for example, sputtering, thermal evaporation, and/or other suitable film-forming methods. The electrical conductive layer material may include a material including, for example, chromium (Cr), molybdenum (Mo), aluminum (Al), copper (Cu), tungsten (W), neodymium (Nd), indium zinc oxide (IZO), indium tin oxide (ITO), and/or combinations, such as, alloys, thereof. The conductive layer material may be one single layer or may include multiple sub-layers. A photoresist layer may be formed on the electrical conductive layer material. The photoresist layer may then be exposed and developed to form a photoresist pattern. The photoresist pattern may then be used as an etch mask to etch, e.g., by a wet etching, the electrical conductive layer material to form a first portion 61 of a source electrode, a first portion 62 of a drain electrode, a first via-hole 91a in the source electrode, and a second via-hole 92a in the drain electrode.

Because the exemplary wet etching may only have etching effect on metal or metal oxide, and may not have etching effect on a non-metal oxide, the use of wet etching for etching the conductive layer material may not etch the ESL material 5 underlying the first portions 61/62 of the source/drain electrodes. The ESL material 5 may thus protect the underlying active layer 4 during this wet etching of the conductive layer material.

Figure 15:
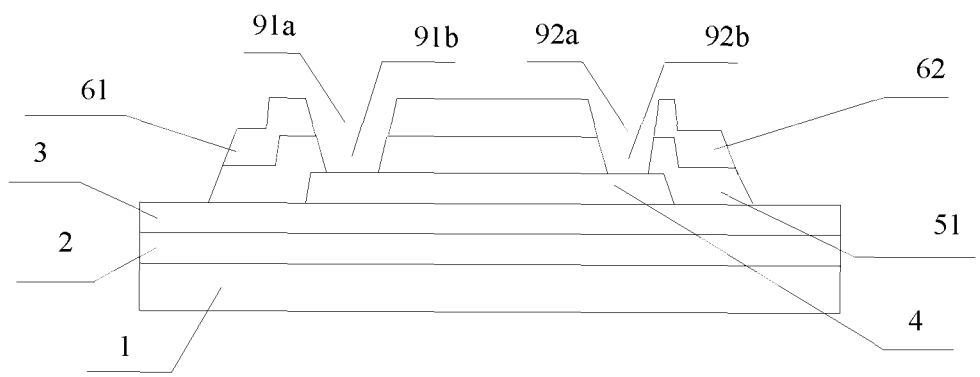
FIG. 15 is a schematic illustrating a structure at a certain stage during formation of an additional exemplary TFT device after forming an etch stop layer according to various disclosed embodiments.

In FIG. 15, the ESL material 5 exposed by the first via-hole 91a and the second via-hole 92a may be etched, e.g., by a dry etching, to form a first ESL via-hole 91b through the ESL material connecting to the first via-hole 91a of the source electrode and to form a second ESL via-hole 92b through the ESL material connecting to the second ESL via-hole 92 of the source electrode. The active layer 4 is then exposed by the first/second ESL via-holes formed through the ESL 5. The photoresist pattern used herein may then be removed.

In this case, the etching process to form the first portions 61/62 in the source/drain electrodes in FIG. 14, and the etching process to etch ESL material 5 in FIG. 15 may use a same, single mask. That is, one of the conventionally used masks may be omitted from the manufacturing process, and the manufacturing cost of the disclosed array substrate may be reduced.

Figure 16:
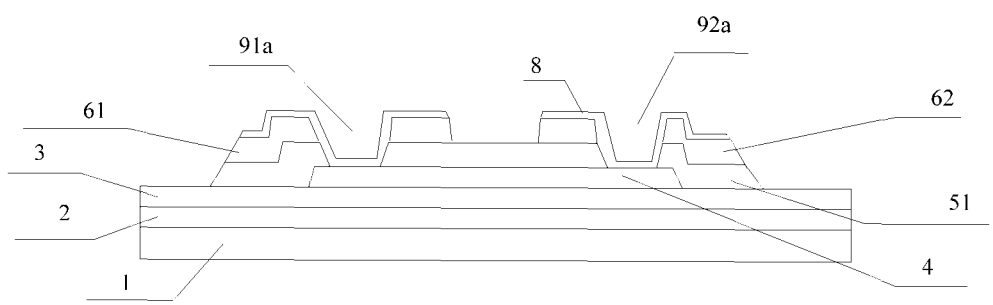
FIG. 16 is a schematic illustrating a structure at a certain stage during formation of an additional exemplary TFT device after forming a second transparent conductive layer according to various disclosed embodiments.

In Step S1906 of FIG. 19, a second transparent conductive layer may be formed by a patterning process. FIG. 16 illustrates a corresponding structure.

As shown in FIG. 16, to form the second transparent conductive layer 8, a transparent conductive layer material may be formed over an entire surface of the structure in FIG. 15, by a method including, for example, magnetron sputtering, thermal evaporation, and/or other film-forming methods. The transparent conductive layer material can include a material including indium tin oxide (ITO), indium zinc oxide (IZO), aluminum zinc oxide (AZO), and/or other suitable materials. A photoresist layer may be formed on the transparent conductive layer. The photoresist layer may be exposed and developed to form a photoresist pattern. The transparent conductive layer material may then be etched (e.g., wet etched) using the photoresist pattern as an etch mask in a photolithography process to form a patterned transparent conductive layer material as the second transparent conductive layer 8.

As shown in FIG. 16, the second transparent conductive layer 8 may be formed on surface of the first portion 61 of the source electrode, on surface of the first portion 62 of the drain electrode, on sidewalls of the first via-hole 91a and sidewalls of the first ESL via-hole 91b through the ESL pattern 51, on sidewalls of the second via-hole 92a and sidewalls of the second ESL via-hole 92b through the ESL pattern 51, and/or on the exposed active layer 4 exposed by the first via-hole 91a and the second via-hole 92a.

In various embodiments, a portion of the second transparent conductive layer 8 can be used as the second portion of the source/drain electrodes to connect the first portions 61/62 of the source/drain electrodes with the active layer 4 via the first via-hole 91a in the source electrode and the first ESL via-hole 91b in the ESL as well as via the second via-hole 92a in the drain electrode and a second ESL via-hole 92b in the ESL.

In various embodiments, referring back to FIG. 14, when etching the electrical conductive layer material to form the via-holes 91a/92a of the source/drain electrodes, the source/drain electrodes to be formed may be connected between the two via-holes 91/92 without being etched (e.g., wet etched) at this step. To the contrary, the source/drain electrodes to be formed may be separated after depositing the transparent conductive layer material (used for forming the second transparent conductive layer 8 by patterning). That is, a portion of each of the deposited transparent conductive layer material along with the underlying conductive layer material between the first via-hole 91a and the second via-hole 92a may be etched away together to expose the a surface portion of the active layer 4, as shown in FIG. 16. Then, the source/drain electrodes may be separated and electrically isolated.

The photoresist pattern may then be removed after forming the second transparent conductive layer 8. In various embodiments, a portion of the second transparent conductive layer 8 can be used as the second portion of the source/drain electrodes to connect the first portions 61/62 of the source/drain electrodes with the active layer 4.

Figure 17:
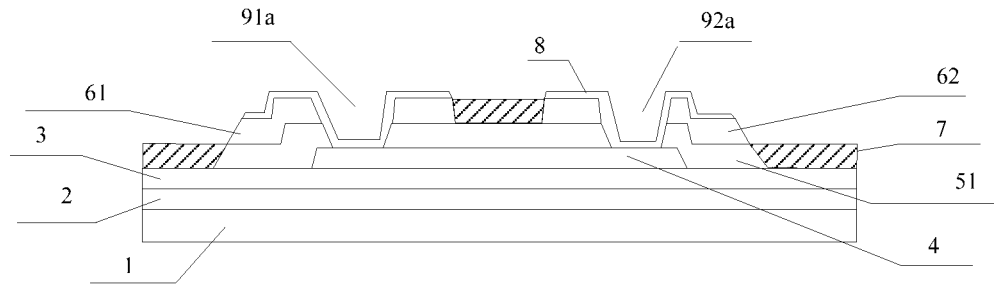
FIG. 17 is a schematic illustrating a structure at a certain stage during formation of an additional exemplary TFT device after forming a passivation layer according to various disclosed embodiments.

In Step S1907 of FIG. 19, a passivation layer is formed by a patterning process. FIG. 17 illustrates a corresponding structure.

In FIG. 17, to form a passivation layer 7, a passivation layer material may be formed on the exposed surface of the structure shown in FIG. 16. For example, the passivation layer material may be formed by a PECVD or other suitable methods. The passivation layer material may be made of a material including $SiN_x$ and/or $SiO_x$. A photoresist layer may then be formed on the passivation layer material. The photoresist layer may be exposed and developed to form a photoresist pattern. The photoresist pattern may be used as an etch mask to etch the passivation layer material covering the entire surface of the structure in FIG. 10, e.g., by a dry etching, to form the passivation layer 7. As shown in FIG. 17, the passivation layer 7 may be formed on the exposed surface portions of the gate insulating layer 3 surrounding the ESL 5, and also on the exposed active layer between the source/drain electrodes. During this etching process, the passivation layer material on the second transparent conductive layer 8 may be removed. The photoresist pattern may then be removed.

Depending on different display modes, the second transparent conductive layer 8 may include other portions used as a common electrode, for example, used for an advanced ultra-dimensional field conversion mode, or a pixel electrode, for example, used for an ultra-dimensional field conversion mode. These other portions of the second transparent conductive layer 8 may be connected with peripheral wirings to transmit a corresponding signal.

The disclosed TFT may be one of a bottom gate type or a top gate type.

Exemplary Embodiment 4

Various embodiments also provide a TFT suitable for an array substrate. For example, as shown in FIGS. 9, 13, and 17, an exemplary TFT may include an active layer 4, an etch stop layer (ESL) 5 on the active layer 4, source/drain electrodes (e.g., first portions 61/62) on the ESL 5, and a transparent conductive layer 8 on the first portions 61/62 of the source/drain electrodes. The source/drain electrodes (e.g., first portions 61/62) are connected to the active layer 4 by the transparent conductive layer 8 disposed on surfaces of first via-hole 91a in the source electrode and of a connected first ESL via-hole 91b through the ESL pattern 51, disposed on surfaces of second via-hole 92a in the drain electrode and of a connected second ESL via-hole 92b through the ESL pattern 51, and disposed on the active layer 4.

The transparent conductive layer 8 includes a portion used as second portion of the source/drain electrode and another portion used as a common electrode or a pixel electrode. In an exemplary embodiment, the source/drain electrodes at least include the first portions 61/62, and may further include a second portion formed by a portion of the transparent conductive layer 8 to connect the source/drain electrodes (e.g., first portions 61/62) with the active layer 4.

In an exemplary embodiment of the array substrate, the active layer may be formed on a gate insulating layer. The gate insulating layer is disposed on a gate electrode. Note that the disclosed array substrate may be used as a bottom gate type, and may also be used as a top gate type.

Exemplary Embodiment 5

Various embodiments further include a display apparatus at least including the disclosed array substrate including the disclosed TFT.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method for forming a thin-film transistor (TFT) device, comprising:
    forming an etch stop layer (ESL) material on an active layer on a substrate;
    forming an electrical conductive layer material on the ESL material for forming a source electrode and a drain electrode;
    patterning the electrical conductive layer material to form a first portion of the source electrode containing a first via-hole through the source electrode, and to form a first portion of the drain electrode containing a second via-hole through the drain electrode; and
    patterning the ESL material to form an etch stop layer (ESL) pattern including a first ESL via-hole connecting to the first via-hole through the source electrode and including a second ESL via-hole connecting to the second via-hole through the drain electrode.

2. The method according to claim 1, wherein a first mask used for patterning the ESL material is used for one of patterning the electrical conductive layer material and patterning a passivation layer material formed over the source electrode and the drain electrode.

3. The method according to claim 2, wherein patterning the electrical conductive layer material and the ESL material, and patterning the passivation layer material include:
    forming a first photoresist layer on the electrical conductive layer material;
    exposing the first photoresist layer using the first mask for patterning the electrical conductive layer material;
    developing the exposed first photoresist layer to form a first photoresist pattern;
    etching the electrical conductive layer material to form the first portion of the source electrode containing the first via-hole through the source electrode, and to form the first portion of the drain electrode containing the second via-hole through the drain electrode;
    forming the passivation layer material over the substrate having the source electrode and the drain electrode; and
    patterning the passivation layer material to form a passivation layer.

4. The method according to claim 3, further including:
    forming a second photoresist layer on the passivation layer material;
    exposing the second photoresist layer using a second mask for patterning the passivation layer material, the second mask being different from the first mask;

developing the second photoresist layer to form a second photoresist pattern;

etching the passivation layer material to form a first portion of the passivation layer between the first portion of the source electrode and the first portion of the drain electrode to expose the first via-hole through the source electrode, and to expose the second via-hole through the drain electrode; and patterning the ESL material to form the ESL pattern including the first ESL via-hole through the ESL material connecting to the first via-hole through the source electrode and including the second ESL via-hole through the ESL material connecting to the second via-hole through the drain electrode using the second mask.

5. The method according to claim 3, wherein the electrical conductive layer material is etched by a wet etching.

6. The method according to claim 4, wherein etching the passivation layer material and patterning the ESL material are accomplished by a dry etching.

7. The method according to claim 2, wherein patterning the electrical conductive layer material and patterning the ESL material include:

using a single patterning process for:
patterning the electrical conductive layer material to form the first portion of the source electrode containing the first via-hole through the source electrode, and to form the first portion of the drain electrode containing the second via-hole through the drain electrode; and patterning the ESL material to form the ESL pattern including the first ESL via-hole connecting to the first via-hole through the source electrode and including the second ESL via-hole connecting to the second via-hole through the drain electrode.

8. The method according to claim 7, wherein using the single patterning process for patterning the electrical conductive layer material and for patterning the ESL material includes:

forming a third photoresist layer on the electrical conductive layer material;

using the first mask for patterning the electrical conductive layer material to expose the third photoresist layer, the third photoresist layer being developed to form a third photoresist pattern;

etching the electrical conductive layer material using the third photoresist pattern to form the first portion of the source electrode containing the first via-hole through the source electrode, and to form the first portion of the drain electrode containing the second via-hole through the drain electrode; and then, etching the ESL material using the third photoresist pattern to form the first ESL via-hole connecting to the first via-hole through the source electrode and to form the second ESL via-hole connecting to the second ESL via-hole through the drain electrode.

9. The method according to claim 7, wherein:
the electrical conductive layer material is etched by a wet etching, and
the ESL material is etched by a dry etching.

10. The method according to claim 7, after the single patterning process, further including:

forming a passivation layer material over the substrate having the source electrode and the drain electrode, and patterning the passivation layer material to form the passivation layer, wherein the passivation layer material is etched to remove portions corresponding to the first via-hole through the source electrode and the second via-hole through the drain electrode and to remove portions of the passivation layer material on the first portion of the source electrode and on the first portion of the drain electrode.

11. The method according to claim 10, wherein the passivation layer is formed between the first portion of the source electrode and the first portion of the drain electrode, exposing the first via-hole through the source electrode and exposing the second via-hole through the drain electrode.

12. The method according to claim 10, after forming the passivation layer, further including:

using a patterning process to form a transparent conductive layer, such that the transparent conductive layer connects the active layer with each of the first portion of the source electrode and the first portion of the drain electrode by having the transparent conductive layer on surfaces of the first via-hole through the source electrode, on surfaces of the second via-hole through the drain electrode, on surfaces of the first ESL via-hole, and on surfaces the second ESL via-hole.

13. The method according to claim 12, wherein the transparent conductive layer includes a common electrode or a pixel electrode.

14. The method according to claim 1, after forming the first via-hole through the source electrode and forming the second via-hole through the drain electrode, further including:

using a patterning process to form a transparent conductive layer such that the transparent conductive layer connects the active layer with each of the first portion of the source electrode and the first portion of the drain electrode by having the transparent conductive layer on surfaces of the first via-hole through the source electrode, on surfaces of the second via-hole through the drain electrode, on surfaces of the first ESL via-hole, and on surfaces the second ESL via-hole.

15. The method according to claim 14, wherein the transparent conductive layer includes a common electrode or a pixel electrode.

16. The method according to claim 1, before forming the ESL material on the active layer further including:

forming a gate electrode on the substrate,
forming a gate insulating layer on the gate electrode, and
forming the active layer on the gate insulating layer.

* * * * *